US 6,566,019 B2

(12) United States Patent
Kling et al.

(10) Patent No.: US 6,566,019 B2
(45) Date of Patent: May 20, 2003

(54) USING DOUBLE EXPOSURE EFFECTS DURING PHASE SHIFTING TO CONTROL LINE END SHORTENING

(75) Inventors: Michael E. Kling, Austin, TX (US); Hua-Yu Liu, Palo Alto, CA (US)

(73) Assignee: Numerical Technologies, Inc., San Jose, CA (US)

( * ) Notice: Subject to any disclaimer, the term of this patent is extended or adjusted under 35 U.S.C. 154(b) by 203 days.

(21) Appl. No.: 09/843,498

(22) Filed: Apr. 25, 2001

(65) Prior Publication Data

US 2002/0142232 A1 Oct. 3, 2002

Related U.S. Application Data

(60) Provisional application No. 60/281,325, filed on Apr. 3, 2001.

(51) Int. Cl.[7] ............................. G03F 9/00; G06F 17/50
(52) U.S. Cl. ............................................. 430/5; 716/19
(58) Field of Search ............................. 430/5, 311, 322, 430/323, 324, 394; 716/19, 21

(56) References Cited

U.S. PATENT DOCUMENTS

| 4,037,918 A | 7/1977 | Kato ........................... 350/3.5 |
| 4,456,371 A | 6/1984 | Lin .............................. 355/71 |
| 5,302,477 A | 4/1994 | Dao et al. ....................... 430/5 |
| 5,308,741 A | 5/1994 | Kemp ......................... 430/312 |
| 5,316,878 A | 5/1994 | Saito et al. ..................... 430/5 |

(List continued on next page.)

FOREIGN PATENT DOCUMENTS

| DE | 195 45 163 A1 | 6/1996 |
| EP | 0 464 492 A1 | 1/1992 |
| EP | 0 653 679 A2 | 5/1995 |
| EP | 0 698 821 | 2/1996 |
| GB | 2333613 A | 7/1999 |

(List continued on next page.)

OTHER PUBLICATIONS

Ackmann, P. et al., "Phase Shifting And Optical Proximity Corrections To Improve CD Control On Logic Devices In Manufacturing For Sub 0.35 μm I–Line", Advance Micro Devices (8 pages).

(List continued on next page.)

Primary Examiner—S. Rosasco
(74) Attorney, Agent, or Firm—Park, Vaughan & Fleming LLP (57) ABSTRACT

One embodiment of the invention provides a system that facilitates a semiconductor fabrication process to create a line end in a manner that controls line end shortening arising from optical effects, and is especially applicable in alternating aperture phase shifting. This system operates by positioning a first mask over a photoresist layer on a surface of a semiconductor wafer. This first mask includes opaque regions and transmissive regions that are organized into a first pattern that defines an unexposed line on the photoresist layer. The system then exposes the photoresist layer through the first mask. The system also positions a second mask over the photoresist layer on the surface of the semiconductor wafer. This second mask includes opaque regions and transmissive regions that are organized into a second pattern that defines an exposure region. This exposure region cuts through the unexposed line on the photoresist layer to create the line end in the unexposed line, without the optical line end shortening that arises from creating the line end with a single mask. The system then exposes the photoresist layer through the second mask.

31 Claims, 8 Drawing Sheets

U.S. PATENT DOCUMENTS

| | | | |
|---|---|---|---|
| 5,324,600 A | 6/1994 | Jinbo et al. | 430/5 |
| 5,328,807 A | 7/1994 | Tanaka et al. | 430/311 |
| 5,334,542 A | 8/1994 | Saito et al. | 437/40 |
| 5,352,550 A | 10/1994 | Okamoto | 430/5 |
| 5,364,716 A | 11/1994 | Nakagawa et al. | 430/5 |
| 5,424,154 A | 6/1995 | Borodovsky | 430/5 |
| 5,472,814 A | 12/1995 | Lin | 430/5 |
| 5,480,746 A | 1/1996 | Jinbo et al. | 430/5 |
| 5,496,666 A | 3/1996 | Chu et al. | 430/5 |
| 5,498,579 A | 3/1996 | Borodovsky et al. | 437/250 |
| 5,503,951 A | 4/1996 | Flanders et al. | 430/5 |
| 5,523,186 A | 6/1996 | Lin et al. | 430/5 |
| 5,527,645 A | 6/1996 | Pati et al. | 430/5 |
| 5,532,090 A | 7/1996 | Borodovsky | 430/5 |
| 5,537,648 A | 7/1996 | Liebmann et al. | 395/500 |
| 5,538,815 A | 7/1996 | Oi et al. | 430/5 |
| 5,539,568 A | 7/1996 | Lin et al. | 359/285 |
| 5,565,286 A | 10/1996 | Lin | 430/5 |
| 5,573,890 A | 11/1996 | Spence | 430/311 |
| 5,595,843 A | 1/1997 | Dao | 430/5 |
| 5,620,816 A | 4/1997 | Dao | 430/5 |
| 5,635,316 A | 6/1997 | Dao | 430/5 |
| 5,636,131 A | 6/1997 | Liebmann et al. | 364/490 |
| 5,702,848 A | 12/1997 | Spence | 430/5 |
| 5,725,969 A | 3/1998 | Lee | 430/5 |
| 5,761,075 A | 6/1998 | Oi et al. | 364/488 |
| 5,766,804 A | 6/1998 | Spence | 430/5 |
| 5,766,806 A | 6/1998 | Spence | 430/5 |
| 5,807,649 A | 9/1998 | Liebmann et al. | 430/5 |
| 5,827,623 A | 10/1998 | Ishida et al. | 430/5 |
| 5,858,580 A | 1/1999 | Wang et al. | 430/5 |
| 5,885,734 A | 3/1999 | Pierrat et al. | 430/5 |
| 5,923,562 A | 7/1999 | Liebmann et al. | 364/488 |
| 5,923,566 A | 7/1999 | Galan et al. | 364/489 |
| 5,994,002 A | 11/1999 | Matsuoka | 430/5 |
| 5,998,068 A | 12/1999 | Matsuoka | 430/5 |
| 6,004,702 A | 12/1999 | Lin | 430/5 |
| 6,010,807 A | 1/2000 | Lin | 430/5 |
| 6,057,063 A | 5/2000 | Liebmann et al. | 430/5 |
| 6,066,180 A | 5/2000 | Kim et al. | 716/19 |
| 6,077,630 A | 6/2000 | Pierrat | 430/5 |
| 6,083,275 A | 7/2000 | Heng et al. | 716/19 |
| 6,130,012 A | 10/2000 | May et al. | 430/5 |
| 6,139,994 A | 10/2000 | Broeke et al. | 430/5 |
| 6,185,727 B1 | 2/2001 | Liebmann | 716/19 |
| 6,228,539 B1 | 5/2001 | Wang et al. | 430/5 |
| 6,251,549 B1 | 6/2001 | Levenson | 430/11 |
| 6,258,493 B1 | 7/2001 | Wang et al. | 430/5 |
| 6,335,128 B1 | 1/2002 | Cobb et al. | 430/5 |
| 6,338,922 B1 | 1/2002 | Liebmann et al. | 430/5 |
| 6,420,074 B2 | 7/2002 | Wang et al. | 430/5 |
| 6,436,590 B2 | 8/2002 | Wang et al. | 430/5 |
| 2001/0000240 A1 | 4/2001 | Wang et al. | 430/5 |
| 2001/0028985 A1 | 10/2001 | Wang et al. | 430/5 |
| 2002/0083410 A1 | 6/2002 | Wu et al. | 716/19 |
| 2002/0127479 A1 | 9/2002 | Pierrat | 430/5 |
| 2002/0129327 A1 | 9/2002 | Pierrat et al. | 716/19 |
| 2002/0136964 A1 | 9/2002 | Pierrat | 430/5 |
| 2002/0142231 A1 | 10/2002 | Kling et al. | 430/5 |
| 2002/0142232 A1 | 10/2002 | Kling et al. | 430/5 |
| 2002/0144232 A1 | 10/2002 | Ma et al. | 716/21 |
| 2002/0152454 A1 | 10/2002 | Cote et al. | 716/21 |
| 2002/0155363 A1 | 10/2002 | Cote et al. | 430/5 |

FOREIGN PATENT DOCUMENTS

| | | |
|---|---|---|
| JP | 62067547 | 3/1987 |
| JP | 2-140743 | 5/1990 |
| JP | 7-111528 | 2/1991 |
| JP | 6-67403 | 3/1994 |
| JP | 8-51068 | 2/1996 |
| JP | 8-236317 | 9/1996 |
| JP | 2638561 | 4/1997 |
| JP | 2650962 | 5/1997 |
| JP | 10-133356 | 5/1998 |
| JP | 11-143085 | 5/1999 |
| WO | WO 98/12605 A1 | 3/1998 |
| WO | WO 01/23961 A1 | 4/2001 |
| WO | WO 02/03140 A1 | 1/2002 |
| WO | WO 02/073312 A1 | 9/2002 |

OTHER PUBLICATIONS

Asai, S. et al., "High Performance Optical Lithography Using A Separated Light Source", *J. Vac. Sci. Technol. B*, vol. 10, No. 6, pp. 3023–3026, Nov./Dec. 1992.

Barouch, E. et al., "OPTIMASK: An OPC Algorithm For Chrome And Phase–Shift Mask Design", *SPIE*, vol. 2440, pp. 192–206, Feb. 1995.

Brunner, "170nm Gates Fabricated By Phase–Shift Mask And Top Anti–Reflector Process", *SPIE*, Optical/Laser Microlithography VI, vol. 1927, pp. 182–189 (1993).

Brunner, "Rim Phase–Shift Mask Combined With Off–Axis Illumination: A Path To 0.5λ/Numerical Aperture Geometries", *Optical Engineering*, vol. 32, No. 10, pp. 2337–2343, Oct. 1993.

Fukuda, H. et al., "Determination Of High–Order Lens Aberration Using Phase/Amplitude Linear Algebra", *J. Vac. Sci. Technol. B*, vol. 17, No. 6, pp. 3318–3321, Nov./Dec. 1999.

Fukuda, H., "Node–Connection/Quantum Phase–Shifting Mask: Path To Below 0.3 λm Pitch, Proximity Effect Free, Random Interconnects And Memory Patterning", *J. Vac. Sci. Technol. B*, vol .17, No. 6, pp. 3291–3295, Nov./Dec. 1999.

Galan, G. et al., "Application Of Alternating–Type Phase Shift Mask To Polysilicon Level For Random Logic Circuits", *Jpn. J. Appl. Phys.*, vol. 33, pp. 6779–6784 (1994).

Inokuchi, K. et al., "Sub–Quarter Micron Gate Fabrication Process Using Phase–Shifting–Mask For Microwave GaAs Devices", Extended Abstracts of the 1991 Intl. Conference on Solid State Devices and Materials, Yokohama, Japan, pp. 92–94 (1991).

Inokuchi, K. et al., "Sub–Quarter–Micron Gate Fabrication Process Using Phase–Shifting Mask For Microwave GaAs Devices", *Japanese Journal of Applied Physics*, vol. 30, No. 12B, pp. 3818–3821, Dec. 1991.

Ishiwata, N. et al., "Novel Alternating Phase Shift Mask With Improved Phase Accuracy", *SPIE*, Proceedings of the 17th Annual Symposium on Photomask Technology and Management, vol. 3236, pp. 243–249 (1997).

Jinbo, H. et al., "0.2 μm Or Less i–Line Lithography By Phase–Shifting–Mask Technology", *IEEE*, pp. 33.3.1–33.3.4 (1990).

Jinbo, H. et al., "Application Of Blind Method To Phase–Shifting Lithography", *IEEE*, 1992 Symposium on VLSI Technology Digest of Technical Papers, pp. 112–113 (1992).

Jinbo, H. et al., "Improvement Of Phase–Shifter Edge Line Mask Method", *Japanese Journal of Applied Physics*, vol. 30, No. 11B, pp. 2998–3003, Nov. 1991.

Karklin, L., "A Comprehensive Simulation Study Of The Photomask Defects Printability", *SPIE*, vol. 2621, pp. 490–504 (1995).

Kimura, T. et al., "Subhalf–Micron Gate GaAs Mesfet Process Phase–Shifting–Mask Technology", *IEEE*, GaAs IC Symposium, pp. 281–284 (1991).

Levenson, M. et al., "Improving Resolution In Photolithography With A Phase–Shifting Mask", *IEEE* Transactions on Electron Devices, vol. ED–29, No. 12, pp. 1828–1836, Dec. 1982.

Lin, B.J., "Phase–Shifting Masks Gain An Edge", *IEEE* Circuits & Devices, pp. 28–35, Mar. 1993.

Liu, H.Y. et al., "Fabrication of 0.1 µm T–Shaped Gates By Phase–Shifting Optical Lithography", *SPIE*, Optical/Laser Microlithography VI, vol. 1927, pp. 42–52 (1993).

Matsuoka, K. et al., "Application Of Alternating Phase–Shifting Mask To 0.16 µm CMOS Logic Gate Patterns", Matsushita Electric Ind. Co., Ltd. (9 pages).

Mizuno, F. et al., "Practical Phase–Shifting Mask Technology For 0.3 µm Large Scale Integrations", *J. Vac. Sci. Technol. B*, vol. 12, No. 6, pp. 3799–3803, Nov./Dec. 1994.

Morimoto, H. et al., "Next Generation Mask Strategy—Technologies Are Ready For Mass Production Of 256MDRAM?", *SPIE*, vol. 3236, pp. 188–189 (1997).

Neureuther, A., "Modeling Phase Shifting Masks", *SPIE*, $10^{th}$ Annual Symposium on Microlithography, vol. 1496, pp. 80–85 (1990).

Nistler, J. et al., "Large Area Optical Design Rule Checker For Logic PSM Application", *SPIE*, Photomask and X–Ray Mask Technology, vol. 2254, pp. 78–92 (1994).

Nistler, J. et al., "Phase Shift Mask Defect Printability Analysis", Proceedings of the Microlithography Seminar INTERFACE '93, OCG Microelectronic Materials, Inc., pp. 11–28 (1993).

Ohtsuka, H. et al., "Phase Defect Repair Method For Alternating Phase Shift Masks Conjugate Twin–Shifter Method", *Jpn. J. Appl. Phys.*, vol. 31, pp. 4143–4149 (1992).

Pati, Y.C. et al., "Phase–Shifting Masks For Microlithography: Automated Design And Mask Requirements", *J. Optc. Soc. Am.*, vol. 11, No. 9, pp. 2438–2452, Sep. 1994.

Pierrat, C. et al., "A Rule–Based Approach To E–Beam And Process–Induced Proximity Effect Correction For Phase–Shifting Mask Fabrication", *SPIE*, vol. 2194, pp. 298–309 (1994).

Pierrat, C. et al., "Phase–Shifting Mask Topography Effects On Lithographic Image Quality", *IEEE*, pp. 3.3.1–3.3.4 (1992).

Rieger, M. et al., "System For Lithography Proximity Compensation", Precim Company, Portland, Oregon, Sep. 1993 (28 pages).

Roman, B. et al., "Implications Of Device Processing On Photomask CD Requirements", *SPIE*, vol. 3236 (1997) (Abstract Only).

Spence, C. et al., "Automated Determination Of CAD Layout Failures Through Focus: Experiment And Simulation", *SPIE*, vol. 2197, pp. 302–313 (1994).

Spence, C. et al., "Detection Of 60° Phase Defects On Alternating PSMs", Advance Micro Devices, KLA–Tencor, DuPont RTC (2 pages).

Spence, C. et al., "Integration Of Optical Proximity Correction Strategies In Strong Phase Shifters Design For Poly–Gate Layers", *Bacus News*, vol. 15, Issue 12, pp. 1, 4–13, Dec. 1999.

Stirniman, J. et al., "Wafer Proximity Correction And Its Impact On Mask–Making", *Bacus News*, vol. 10, Issue 1, pp. 1, 3–7, 10–12, Jan. 1994.

Sugawara, M. et al., "Defect Printability Study Of Attenuated Phase–Shifting Masks For Specifying Inspection Sensitivity", Semiconductor Company, Sony Corporation, Kanagawa, Japan (16 pages).

Terasawa, T. et al., "0.3–Micron Optical Lithography Using A Phase–Shifting Mask", *SPIE*, Optical/Laser Microlithography II, vol. 1088, pp. 25–33, Mar. 1989.

Watanabe, H. et al., "Detection And Printability Of Shifter Defects In Phase–Shifting Masks II Defocus Characteristics", *Jpn. J. Appl. Phys.*, vol. 31, pp. 4155–4160 (1992).

Wiley, J. et al., "Phase Shift Mask Pattern Accuracy Requirements And Inspection Technology", *SPIE*, Integrated Circuit Metrology, Inspection, and Process Control V, vol. 1464, pp. 346–355 (1991).

Cooke, M., "OPC/PSM Designs For Poly Gate Layers", European Semiconductor, vol. 22, No. 7, pp. 57–59, Jul. 2000.

Granik, Y., et al., "Sub–Resolution Process Windows And Yield Estimation Technique Based On Detailed Full–Chip CD Simulation", SPIE, vol. 4182, pp. 335–341 (2000).

Plat, M. et al., "The Impact of Optical Enhancement Techniques on the Mask Error Enhancement Function (MEEF)", SPIE, vol. 4000, pp. 206–214, Mar. 1–3, 2000.

Mansuripur, M., et al., "Projection Photolithography", Optics & Photonics News 11, 17 pages, Feb. 2000.

Wang, R., et al., "Plarized Phase Shift Mask: Concept, Design, and Potential Advantages to Photolithography Process and Physical Design", Motorola Semiconductor Product Sector (12 pages).

Ogawa, K., et al., "Phase Defect Inspection by Differential Interference", Lasertec Corporation (12 pages).

Pistor, T., "Rigorous 3D Simulation of Phase Defects in Alternating Phase–Shifting Masks", Panoramic Technology Inc. (12 pages).

Semmier, A., et al., "Application of 3D EMF Simulation for Development and Optimization of Alternating Phase Shifting Masks", Infineon Techniques AG (12 pages).

Wong, A., et al., "Polarization Effects in Mask Transmission", University of California Berkeley (8 pages).

Hirai, Y., et al., "Automatic Pattern Generation System for Phase Shifting Mask", 1991 Symposium on VLSI Technology, Digest of Technical Papers, pp. 95–96, May 28–30, 1991.

Wong, A., et al., "Investigating Phase–Shifting Mask Layout Issues Using a Cad Toolkit", IEEE, pp. 27.4.1–27.4.4 (1991).

Terasawa, T., et al., "Imaging Characteristics of Multi–Phase–Shifting and Halftone Phase–Shifting Masks", Japanese Journal of Applied Physics, vol. 30, No. 11B, pp. 2991–2997, Nov. 1991.

Inoue, S., et al., "Simulation Study on Phase–Shifting Masks for Isolated Patterns", Japanese Journal of Applied Physics, vol. 30, No. 11B, pp. 3010–3015, Nov. 1991.

Watanabe, H., et al., "Detection and Printability of Shifter Defects in Phase–Shifting Masks", Japanese Journal of Applied Physics, vol. 30, No. 11B, pp. 3016–3020, Nov. 1991.

Watanabe, H., et al., "Pattern Transfer Characteristics of Transparent Phase Shifting Mask", Japanese Journal of Applied Phsyics, vol. 30, No. 11B, pp. 3004–3009, Nov. 1991.

Moniwa, A., et al., "Algorithm for Phase–Shift Mask Design with Priority on Shifter Placement", Jpn. J. Appl. Phys., vol. 32, Pt. 1, No. 12B, pp. 5874–5879, Dec. 1193.

Ooi, K., et al., "Computer Aided Design Software for Designing Phase–Shifting Masks", Jpn. J. Appl. Phys., vol. 32, Pt. 1, No. 12B, pp. 5887–5891, Dec. 1993.

Ohtsuka, H., et al., "Evaluation of Repair Phase and Size Tolerance for a Phase–Shift Mask", J. Vac. Sci. Technol. B, vol. 11, No. 6, pp. 2665–2668, Nov./Dec. 1993.

Moniwa, A., et al., "Heuristic Method for Phase–Conflict Minimization in Automatic Phase–Shift Mask Design", Jpn. J. Appl. Phys., vol. 34, Pt. 1, No. 12B, pp. 6584–6589, Dec. 1995.

Ohnuma, H., et al., "Lithography Computer Aided Design Technology for Embedded Memory in Logic", Jpn. J. Appl. Phys., vol. 37, Part I, No. 12B, pp. 6686–6688, Dec. 1998.

Kikuchi, K., et al., "Method of Expanding Process Window for the Double Exposure Technique with alt–PSMs", Optical Microlithography XIII, Proceedings of SPIE, vol. 4000, pp. 1221–131 (2000).

Wong, A., et al., "Alternating Phase–Shifting Mask with Reduced Aberration Sensitivity: Lithography Considerations", Proc. SPIE, vol. 4346, pp. 1–9 (2001).

Schmidt, R., et al., "Impact of Coma on CD Control for Multiphase PSM Designs", AMD, ASML (11 pages).

Erdman, A., "Topography Effects and Wave Aberrations in Advanced PSM–Technology", Fraunhofer Institute of Integrated Circuits (11 pages).

Granik, Y., et al., "CD Variation Analysis Technique and its Application to the Study of PSM Mask Misalignment", Mentor Graphics (9 pages).

Hanyu, et al., "New Phase–Shifting Mask with Highly Transparent SiO2 Phase Shifters", Fujitsu Laboratories Ltd. (11 pages).

Ishiwata, N., et al., "Fabrication of Phase–Shifting Mask", Fujitsu Limited (11 pages).

Levenson, M., et al., "Phase Phirst! An Improved Strong–PSM Paradigm", M.D. Levenson Consulting, Petersen Advanced Lithography, KLA–Tencor (10 pages).

Levenson, M., et al., "SCAA Mask Exposures and Phase Phirst Design for 110nm and Below", M.D. Levenson Consulting, Canon USA, Inc., JSR Microelectronics, Inc. (10 pages).

Lin, B.J., "The Relative Importance of the Building Blocks for 193nm Optical Lithography", Linnovation, Inc. (12 pages).

McCallum, M., et al., "Alternating PSM Mask Performance—a Study of Multiple Fabrication Technique Results", International SEMATECH (6 pages).

Morikawa, Y., et al., "100nm–alt.PSM Structure Discussion for ArF Lithography", Dai–Nippon Printing Co., Ltd. (15 pages).

Ozaki, T., et al., "A 0.15um KrF Lithography for 1Gb DRAM Product Using Highly Printable Patterns and Thin Resist Process", Toshiba Corporation (2 pages).

Rhyins, P., et al., "Characterization of Quartz Etched PSM Masks for KrF Lithography at the 100nm Node", Photronics, Inc., MIT Lincoln Lab, ARCH Chemicals, Finle Technologies, KLATencor Corp. (10 pages).

Ronse, K., et al., "Thin Film Interference Effects in Phase Shifting Masks Causing Phase and Transmittance Errors", IMEC (15 pages).

Rosenbluth, A., et al., "Optimum Mask and Source Patterns to Print a Given Shape", IBM (17 pages).

Sakata, M., et al., "A Novel Radiation Sensitive Spin–on–Glass Convertible into SiO2 and the Simple Fabrication Process Using It", Oki Electric Industry Co. Ltd. (3 pages).

Schmidt, R., et al., "Impact of Coma on CD Control for Multiphase PSM Designs", AMD, ASML (10 pages).

Sewell, H., et al., "An Evaluation of the Dual Exposure Technique", SVG Lithography Systems Inc. (11 pages).

Spence, C., et al., "Optimization of Phase–Shift Mask Designs Including Defocus Effects", AMD, Princeton University, Vecor Technologies Inc. (8 pages).

Suzuki, A., et al., "Multilevel Imaging System Realizing k1=.3 Lithography", Canon Inc. (13 pages).

Vandenberghe, G., et al., "(Sub–1)100nm Gate Patterning Using 248nm Alternating PSM", IMEC, Mentor Graphics (9 pages).

Fritze, M., et al., "100–nm Node Lithography with KrF?", MIT Lincoln Lab, Numberical Technologies, Photronics, Arch Chemicals (14 pages).

Fukuda, H., et al., "Patterning of Random Interconnect Using Double Exposure of Strong–Type PSMs", Hitachi Central Research Lab (8 pages).

Ferguson, R., et al., "Pattern–Dependent Correction of Mask Topography Effects for Alternating Phase–Shifting Masks", IBM Microelectronics, University of California Berkeley (12 pages).

Toublan, O., et al., "Phase and Transmission Errors Aware OPC Solution for PSM: Feasibility Demonstration", Mentor Graphics Corp. (7 pages).

Yanagishita, Y., et al., "Phase–Shifting Photolithography Applicable to Real IC Patterns", Fujitsu Limited (11 pages).

Levenson, M., et al., "The Phase–Shifting Mask II: Imaging Simulations and Submicrometer Resist Exposures", IEEE Transactions on Electron Devices, vol. ED–31, No. 6, pp.753–763, Jun. 1984.

IBM, "Method to Produce Sizes in Openings in Photo Images Smaller Than Lithographic Minimum Size", IBM Technical Disclosure Bulletin, vol. 29, No. 3, p. 1328, Aug. 1986.

Buraschi, M., et al., "Optical–Diffraction–Based Modulation of Photoresist Profile or Microlithography Applications", Optical Engineering, vol. 28, No. 6, pp. 654–658, Jun. 1989.

Nitayama, A., et al., "New Phase Shifting Mask with Self–Aligned Phase Sifters for a Quarter Micron Photolithography", IEDM, pp. 3.3.1–3.3.4, Dec. 3–6, 1989.

Toh, K., et al. "Chromeless Phase–Shifted Masks: A New Approach to Phase–Shifting Masks", BACUS—Tenth Annual Symposium on Microlithography, Sep. 1990 (27 pages).

Yamanaka, T., et al., "A 5.9um2 Super Low Power SRAM Cell Cell Using a New Phase–Shift Lithography", IEDM, pp. 18.3.1–18.3.4 (1990).

Nakagawa, K., et al., "Fabrication of 64m DRAM with I–Line Phase–Shift Lithography", IEDM, pp. 33.1.1–33.1.4 (1990).

Watanabe, H., et al., "Transparent Phase Shifting Mask", IEDM, pp. 33.2.1–33.2.4 (1990).

Burggraaf, P., "Four More Significant Japanese Advance in Phase Shifting Technology", Semiconductor International, p. 16, Dec. 1991.

Kemp, K., et al., "Optimized Phase Shift Mask Designs for Real Devices", KTI Microlithography Seminar, pp. 67–75, Oct. 14–15, 1991.

Newmark, D., et al., "Phase–Shifting Mask Design Tool", SPIE—11th Annual BACUS Symposium on Photmask Technology, vol. 1604, pp. 226–235, Sep. 25–27, 1991.

Nolscher, C., et al., "Investigation of Self–Aligned Phase–Shifting Reticles by Simulation Techniques", SPIE—Optical/Laser Microlithography IV, vol. 1463, pp. 135–150 (1991).

Burggraaf, P., "Lithography's Leading Edge, Part 1: Phase–Shift Technology and Part 2: I–Line and Beyond", Semiconductor International, pp. 43–47 and 52–56, Feb. 1992.

Hosono, K., et al., "A Novel Architecture for High Speed Dual Image Generation on Pattern Data for Phase Shifting Reticle Inspection," SPIE—Integrated Circuit Metrology, Inspection, and Process Control VI, vol. 1673, pp. 229–235 (1992).

IBM, "Phase–Shift Mask Utilizing Silicon Oxy–Nitride as a Low Reflectivity Phase–Shift Layer", IBM Technical Disclosure Bulletin, vol. 34, No. 10B, pp. 360–361, Mar. 1992.

Ronse, K., et al., "Comparison of Various Phase Shift Strategies and Application to 0.35um ASIC Designs", SPIE—Optical/Laser Microlithography VI, vol. 1927, pp. 2–16 (1993).

Troccolo, P., et al., "Interferometric Measurement of Etch Depths in Phase Shift Masks", BACUS News, vol. 9, Issue 6, pp. 1 & 4–6, Jun. 1993.

Watanabe, H., et al., "Phase–Shifting Lithography: Maskmaking and its Application", J. Vac. Sci. Technol. B, vol. 11, No. 6, pp. 2669–2674, Nov./Dec. 1993.

Waas, T., et al., "Automatic Generation of Phase Shift Mask Layouts", Microelectronic Engineering, vol. 23, pp. 139–142 (1994).

Langston, J., et al., "Extending Optical Lithography to 0.25um and Below", Solid State Technology, pp. 57–64, Mar. 1995.

Nagahiro, Y., "Improved Mask Technique for Photolithography Applied to 0.25um LSI—Improvement of Resolution, Pattern Correction, Exposure Area", Nikkei Microdevices, pp. 1–6, Apr. 1995.

Okamoto, Y., et al., "A New Phase Shifting Mask Technology for Quarter Micron Photolithography", SPIE, vol. 2512, pp. 311–318 (1995).

Pierrat, C., et al., "Required Optical Characteristics of Materials for Phase–Shifting Masks", Applied Optics, vol. 34, No. 22, pp. 4923–4928, Aug. 1, 1995.

Galan, G., et al., "Alternating Phase Shift Generation for Coplex Circuit Designs", SPIE, vol. 2884, pp. 508–519, Sep. 18–20, 1996.

Kanai, H., et al., "Sub–Quarter Micron Lithography with the Dual–Trench Type Alternating PSM", SPIE, vol. 2793, pp. 165–173 (1996).

Ishida, S., et al., "Large Assist Feature Phase–Shift Mask for Sub–Quarter Micrometer Window Pattern Formation", SPIE, vol. 3096, pp. 333–343 (1997).

Nakae, A., et al., "A Proposal for Pattern Layout Rule in Application of Alternating Phase Shift Mask", SPIE, vol. 3096, pp. 362–374 (1997).

Tsujimoto, E., et al., "Hierarchical Mask Data Design System (PROPHET) for Aerial Image Simulation, Automatic Phase–Shifter Placement, and Subpeak Overlap Checking", SPIE, vol. 3096, pp. 163–172 (1997).

Yamamoto, K., et al., "Hierarchical Processing of Levenson–Type Phase Shifter Generation", Jpn. J. Appl. Phys., vol. 36, Part 1, No. 12B, pp. 7499–7503, Dec. 1997.

Gordon, R., et al., "Design and Analysis of Manufacturable Alternating Phase–Shifting Masks", Bacus News, vol. 14, Issue 12, pp. 1–9, Dec. 1998.

Nara, M., et al., "Phase Controllability Improvement for Alternating Phase Shift Mask", Dai Nippon Printing Co., Ltd. (16 pages).

Petersen, J., et al., "Designing Dual–Trench Alternating Phase–Shift Masks for 140nm and Smaller Features Using 248–nm Krf and 193–nm ArF Lithography", Bacus News, vol. 14, Issue 8, pp. 1 & 4–13, Aug. 1998.

Kuo, C., et al., "Extension of Deep–Ultraviolet Lithography for Patterning Logic Gates Using Alternating Phase Shifting Masks", J. Vac. Sci. Technol. B, vol. 17, No. 6, pp. 3296–3300, Nov./Dec. 1999.

Palmer, S., et al., "Dual Mask Model–Based Proximity Correction for High Performance 0.10um CMOS Process", The 44th International Conference on Electron, Ion and Photon Beam Technology and Nanofabrication Abstracts, pp. 18–19, May 30–Jun.

Pierrat, C., "Investigation of Proximity Effects in Alternating Aperature Phase Shifting Masks", Numerical Technologies, Inc. (11 pages).

Cote, M., et al., "A Practical Application of Full–Feature Alternating Phase–Shifting Technology for a Phase–Aware Standard–Cell Design Flow", Numerical Technologies Inc. (6 pages).

Heng, F., et al., "Application of Automated Design Migration to Alternating Phase Shift Mask Design", IBM Research Report RC 21978 (98769), Feb. 26, 2001 (7 pages).

USING DOUBLE EXPOSURE EFFECTS DURING PHASE SHIFTING TO CONTROL LINE END SHORTENING

RELATED APPLICATION

This application hereby claims priority under 35 U.S.C. 119 to U.S. Provisional Patent Application No. 60/281,325 filed Apr. 3, 2001, entitled "Using Double Exposure Effects During Phase Shifting to Control Line End Shortening," by the same inventors as the instant application.

FIELD OF THE INVENTION

The invention relates to the process of fabricating semiconductor chips. More specifically, the invention relates to a method and an apparatus for using double exposure, especially during alternating aperture phase shifting, to control line end shortening arising from optical effects during the semiconductor fabrication process.

BACKGROUND

Related Art

Recent advances in integrated circuit technology have largely been accomplished by decreasing the feature size of circuit elements on a semiconductor chip. As the feature size of these circuit elements continues to decrease, circuit designers are forced to deal with problems that arise as a consequence of the optical lithography process that is typically used to manufacture integrated circuits. This optical lithography process generally begins with the formation of a photoresist layer on the surface of a semiconductor wafer. A mask composed of opaque regions, which are generally formed of chrome, and transmissive clear regions (chromeless), which are generally formed of quartz, is then positioned over this photo resist coated wafer. (Note that the term "mask" as used in this specification is meant to include the term "reticle.") Exposure energy is then shone on the mask from an exposure energy source, such as a visible light source or an ultraviolet light source.

This exposure energy is generally reduced and focused through an optical system that contains a number of lenses, filters and mirrors. The exposure energy passes through the clear regions of the mask and exposes the underlying photoresist layer. At the same time, the exposure energy is blocked by opaque regions of mask, leaving underlying portions of the photoresist layer unexposed.

The exposed photoresist layer is then developed, typically through chemical removal of the exposed/non-exposed regions of the photoresist layer. The end result is a semiconductor wafer with a photoresist layer having a desired pattern. This pattern can then be used for etching underlying regions of the wafer.

Figure 1:
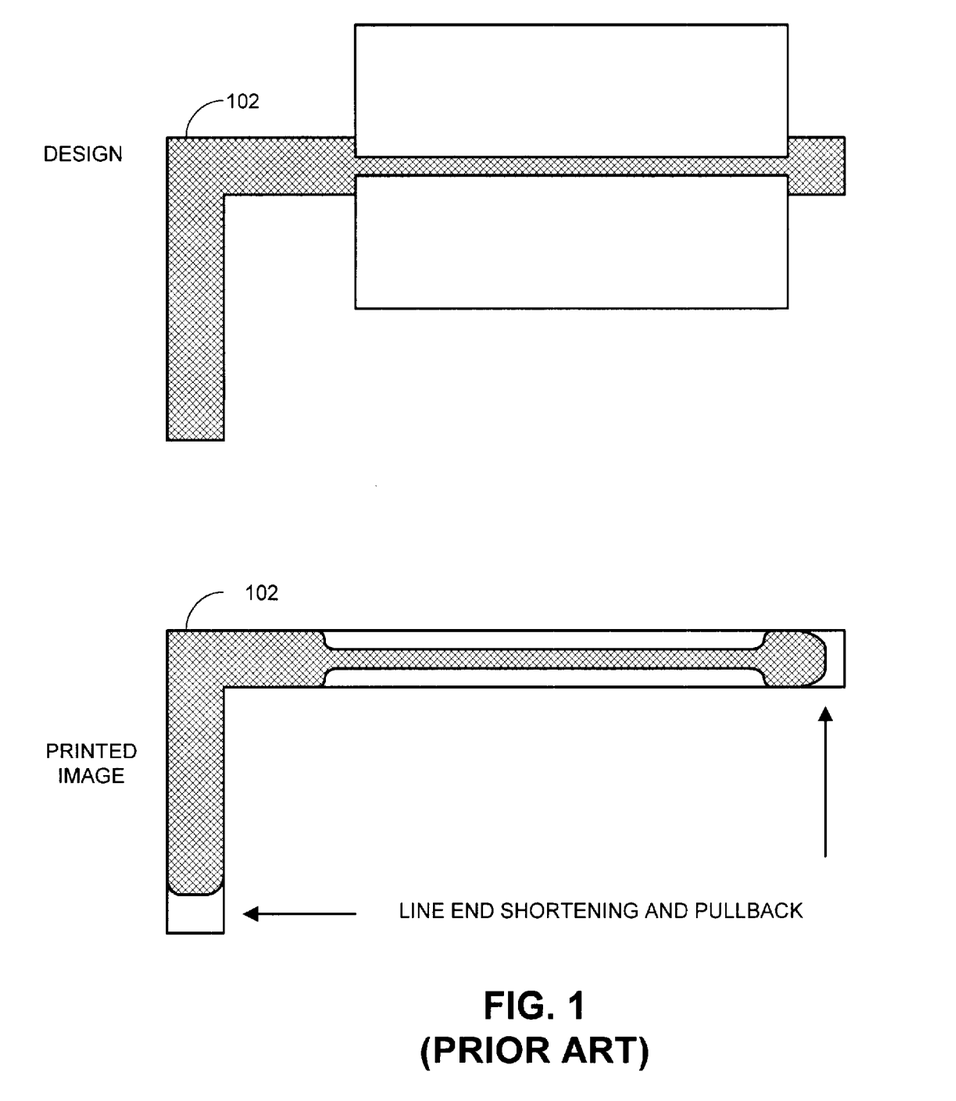
FIG. 1 illustrates the line end shortening problem.

One problem that arises during the optical lithography process is "line end shortening" and "pullback" caused by optical effects. For example, the upper portion of FIG. 1 illustrates a design of a transistor with a polysilicon line 102, running from left to right, that forms a gate region used to electrically couple an upper diffusion region with a lower diffusion region. The lower portion of FIG. 1 illustrates the actual printed image that results from the design. Note that polysilicon line 102 has been narrowed using optical phase shifting in order to improve the performance of the transistor by reducing the resistance through the gate region.

Also note that because of optical effects and resist pullback there is a significant amount of line end shortening.

Figure 2:
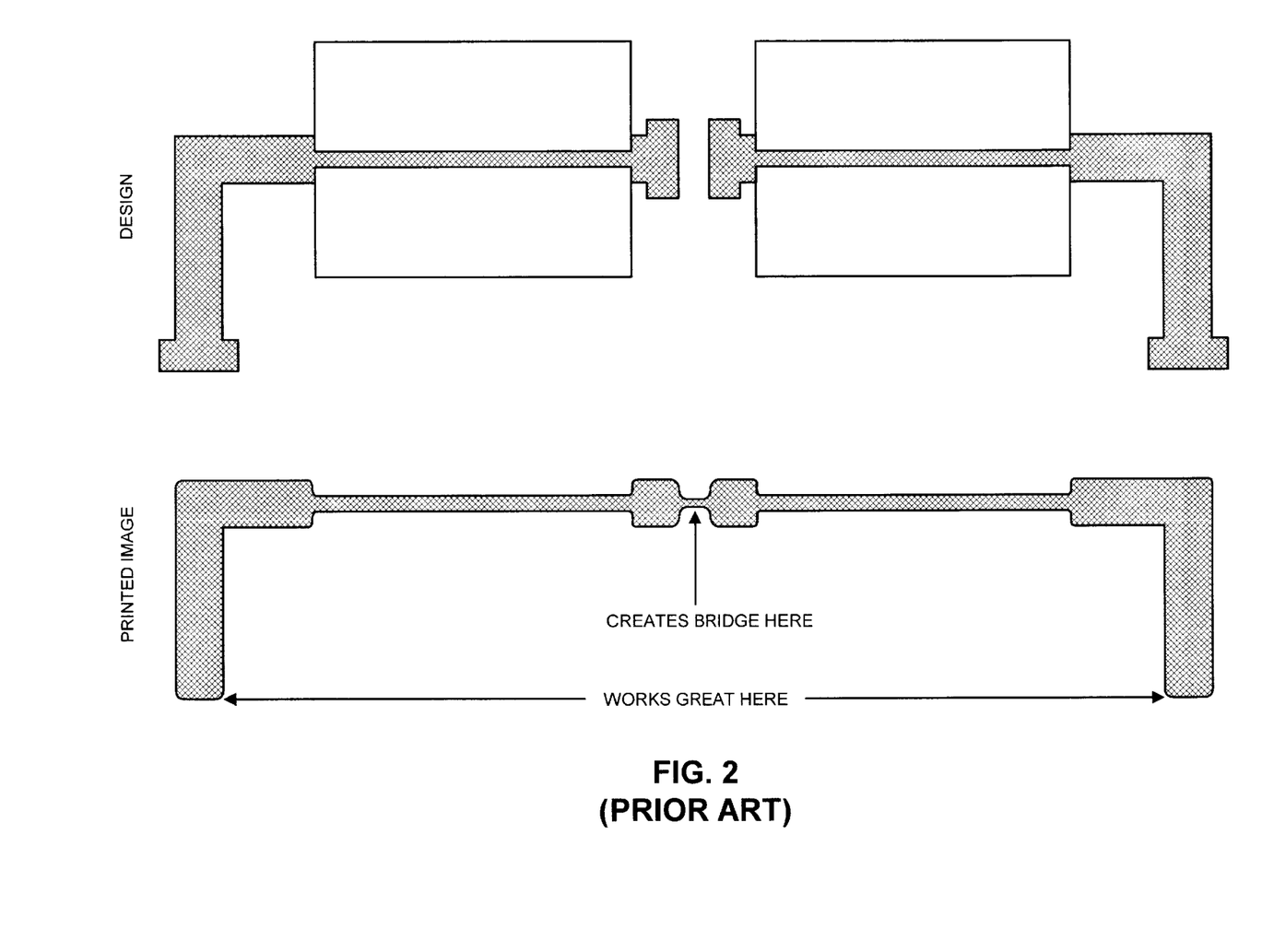
FIG. 2 illustrates the use of hammer heads to compensate for the line end shortening problem.

In order to compensate for line end shortening, designers often add additional features, such as "hammer heads," onto line ends. As is illustrated in FIG. 2, these additional features can effectively compensate for the problem of line end shortening in some situations. However, if these additional features cause line ends to get too close together, a bridge can potentially be created as is illustrated in the middle portion of FIG. 2.

This bridging problem can be alleviated by introducing a separation between the hammer heads. However, introducing such a separation increases the size of the circuit element, which means that fewer circuit elements can be integrated into the semiconductor chip. Additionally, if hammerheads are added after layout, a design rule violation may occur.

What is needed is a method and an apparatus for mitigating the line end shortening problem without introducing additional separation between line ends.

Another problem in optical lithography arises from incidental exposure caused by phase shifters. Phase shifters are often incorporated into a mask in order to achieve line widths that are smaller than the wavelength of the exposure energy that is used to expose the photoresist layer through the mask. During phase shifting, the destructive interference caused by two adjacent clear areas on a mask is used to create an unexposed area on the photoresist layer. This is accomplished by exploiting the fact that exposure energy passing through a mask's clear regions exhibits a wave characteristic having a phase that is a function of the distance the exposure energy travels through the mask material. By placing two clear areas adjacent to each other on the mask, one of thickness $t_1$ and the other of thickness $t_2$, one can obtain a desired unexposed area on the underlying photoresist layer caused by interference. By varying the thickness $t_1$ and $t_2$ appropriately, the exposure energy exiting the material of thickness $t_2$ is 180 degrees out of phase with the exposure energy exiting the material of thickness $t_1$. Phase shifting is described in more detail in U.S. Pat. No. 5,858,580, entitled "Phase Shifting Circuit Manufacture Method and Apparatus," by inventors Yao-Ting Wang and Yagyensh C. Pati, filed Sep. 17, 1997 and issued Jan. 12, 1999, which is hereby incorporated by reference.

Figure 6:
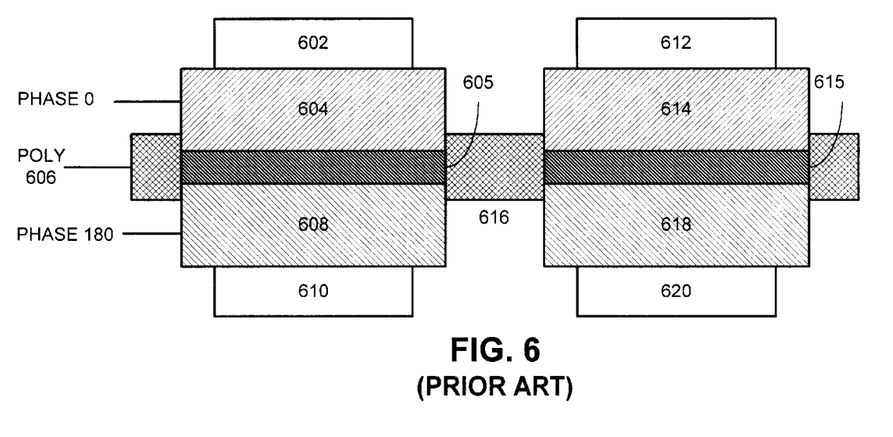
FIG. 6 illustrates two neighboring phase shifters with a potential area of incidental exposure between them.

One problem with phase shifters is that they often cause incidental exposure in neighboring regions of the photoresist layer. For example, FIG. 6 illustrates how two phase shifters are used to reduce the thickness of a polysilicon line 606 in the gate regions of two transistors.

A first phase shifter is composed of a zero-degree phase clear area 604 that works in concert with a 180-degree phase clear area 608 to reduce the width of polysilicon line 606 in the gate region of a first transistor. This first transistor selectively creates a conducting path between diffusion region 602 and diffusion region 610.

Note that a thin chromium regulator 605 is typically added to the mask between zero-degree phase clear area 604 and 180-degree phase clear area 608 in order to shield a portion of the underling photoresist layer.

Similarly, a second phase shifter is composed of a zero-degree phase clear area 614 that works in concert with a 180-degree phase clear area 618 to reduce the width of polysilicon line 606 in the gate region of a second transistor. This second transistor selectively creates a conducting path between diffusion region 612 and diffusion region 620. Within the second phase shifter, chromium regulator 615 separates zero-degree phase clear area 604 and 180-degree phase clear area 608.

The first and second phase shifters are typically incorporated into a separate phase shifting mask, which is used to reduce the width of polysilicon line 606 in the gate regions of the first transistor and the second transistor, respectively.

Unfortunately, using these phase shifters often causes incidental exposure of polysilicon line 606 in the field regions of integrated circuit, such as section 616 of polysilicon line 606. This incidental exposure can degrade performance of section 616, or can cause a broken line in section 616.

Figure 7:
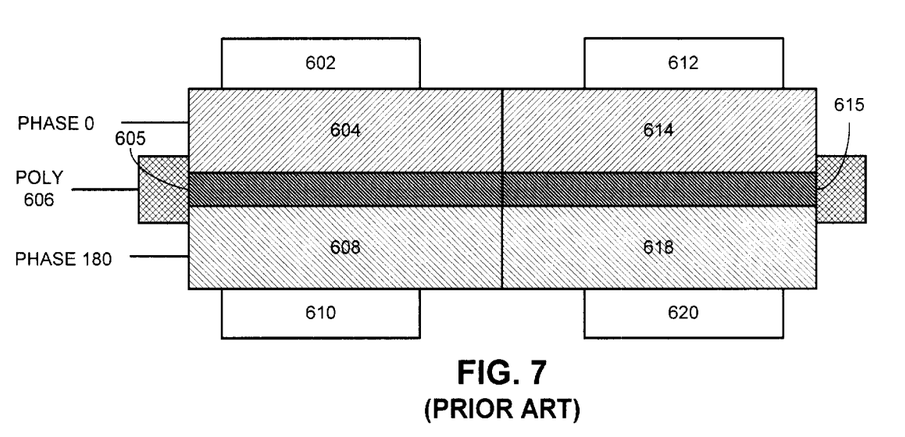
FIG. 7 illustrates the technique of extending phase shifters to protect a polysilicon line in a field region to avoid incidental exposure.

One solution to this problem is to extend the first and second phase shifters into the field region, as is illustrated in FIG. 7. In this way the first and second phase shifters are effectively combined into a single long phase shifter.

This solution protects polysilicon line 606 from incidental exposure. However, it also reduces the width of polysilicon line 606 in the field region between the first and second transistors. This increases the resistance of polysilicon line 606 in the field region, and can thereby degrade performance.

What is needed is a method and an apparatus for reducing incidental exposure caused by phase shifting without the resistance problems caused by extending phase shifters over polysilicon lines in field regions.

SUMMARY

One embodiment of the invention provides a system that facilitates a semiconductor fabrication process to create a line end in a manner that controls line end shortening arising from optical effects. This system operates by positioning a first mask over a photoresist layer on a surface of a semiconductor wafer. This first mask includes opaque regions and transmissive regions that are organized into a first pattern that defines an unexposed line on the photoresist layer. The system then exposes the photoresist layer through the first mask. The system also positions a second mask over the photoresist layer on the surface of the semiconductor wafer. This second mask includes opaque regions and transmissive regions that are organized into a second pattern that defines an exposure region. This exposure region cuts through the unexposed line on the photoresist layer to create the line end in the unexposed line, without the optical line end shortening that arises from creating the line end with a single mask. The system then exposes the photoresist layer through the second mask.

In one embodiment of the invention, exposing the photoresist layer through the first mask takes place before exposing the photoresist layer through the second mask.

In one embodiment of the invention, exposing the photoresist layer through the second mask takes place before exposing the photoresist layer through the first mask.

In one embodiment of the invention, the system creates the first mask by extending the unexposed line into the exposure region defined by the second mask, so that the exposure region cuts through the extended unexposed line to create the line end.

In one embodiment of the invention, the exposure region includes a border that cuts through the unexposed line at a substantially 90-degree angle to create the line end in the unexposed line.

In one embodiment of the invention, the exposure region cuts through the unexposed line to create two opposing line ends on opposite sides of the exposure region.

In one embodiment of the invention, either the first mask or the second mask is a phase shifting mask that includes a set of structures that use phase shifting to produce regions of destructive interference on the photoresist layer. In a variation on this embodiment, the phase shifting mask includes an existing phase shifter that is configured to create a region of destructive interference on a photoresist layer. It also includes a problem area of likely incidental exposure in close proximity to the existing phase shifter. This problem area includes a polysilicon line passing through a field region of the semiconductor chip. The phase shifting mask also includes an additional phase shifter located in the problem area on the phase shifting mask so that a regulator within the additional phase shifter protects the polysilicon line passing through the field region. Note that this additional phase shifter has a wider regulator than the existing phase shifter, wherein the existing phase shifter is used to expose a polysilicon line in a gate region of the semiconductor chip.

In one embodiment of the invention, the second pattern on the second mask defines a plurality of exposure regions for cutting through a plurality of unexposed lines defined by the first mask.

In one embodiment of the invention, the second pattern on the second mask additionally defines a second unexposed line. Furthermore, the first pattern on the first mask additionally defines a second exposure region that cuts through the second unexposed line to create a line end in the second unexposed line.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the invention. Thus, the invention is not intended to be limited to the embodiments shown, but is to be accorded the widest scope consistent with the principles and features disclosed herein.

The data structures and code described in this detailed description are typically stored on a computer readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet.

Using Double Exposure to Control Line End Shortening

Figure 3A:
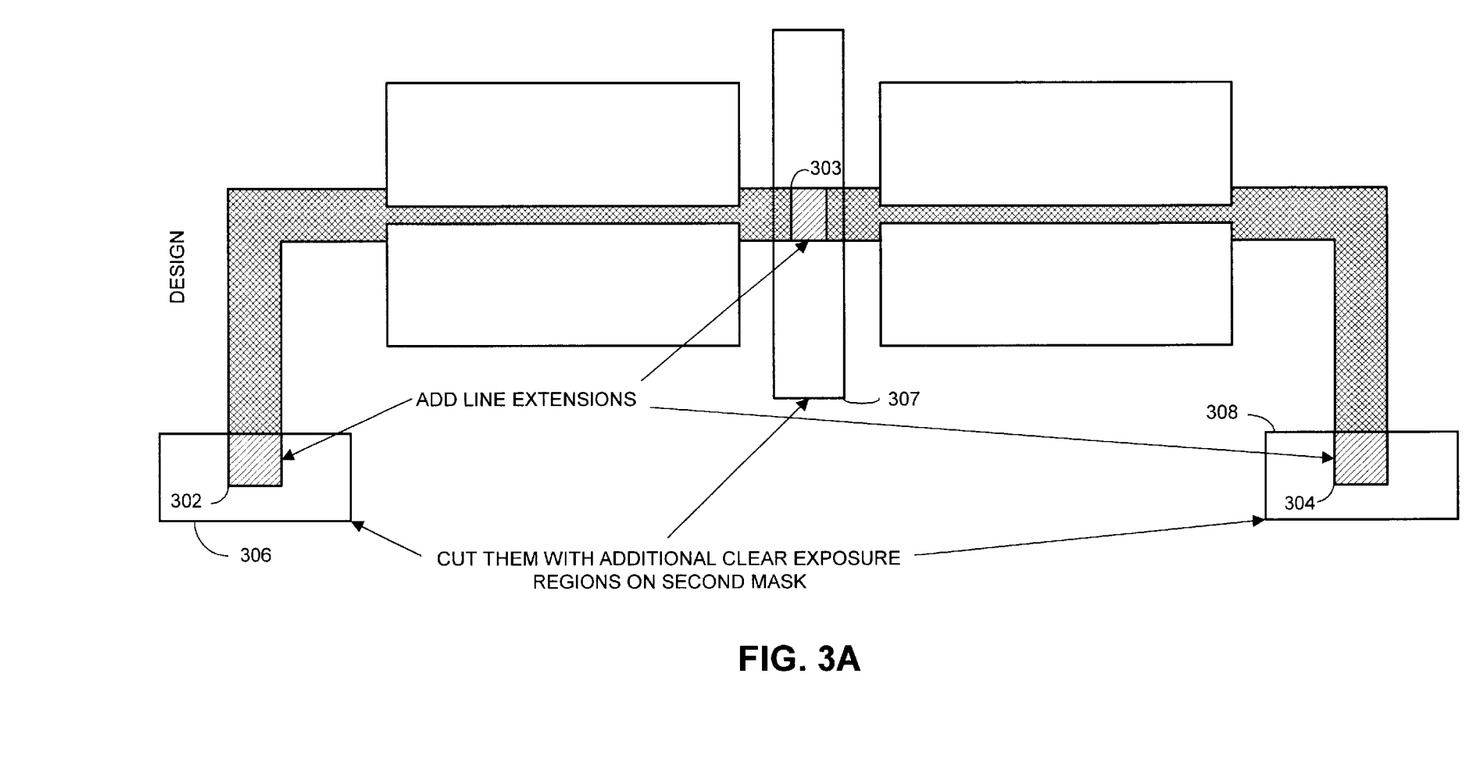
FIG. 3A illustrates the use of exposure regions to cut line ends in accordance with an embodiment of the invention.

FIG. 3A illustrates the use of exposure regions to cut line ends in accordance with an embodiment of the invention. Line end extensions 302–304 are first added to a first mask to create the polysilicon lines for two transistors illustrated in FIG. 3A. Next, clear exposure regions 306–308 are created within a second mask in order to cut through the extended polysilicon lines created by the first mask.

Figure 3B:
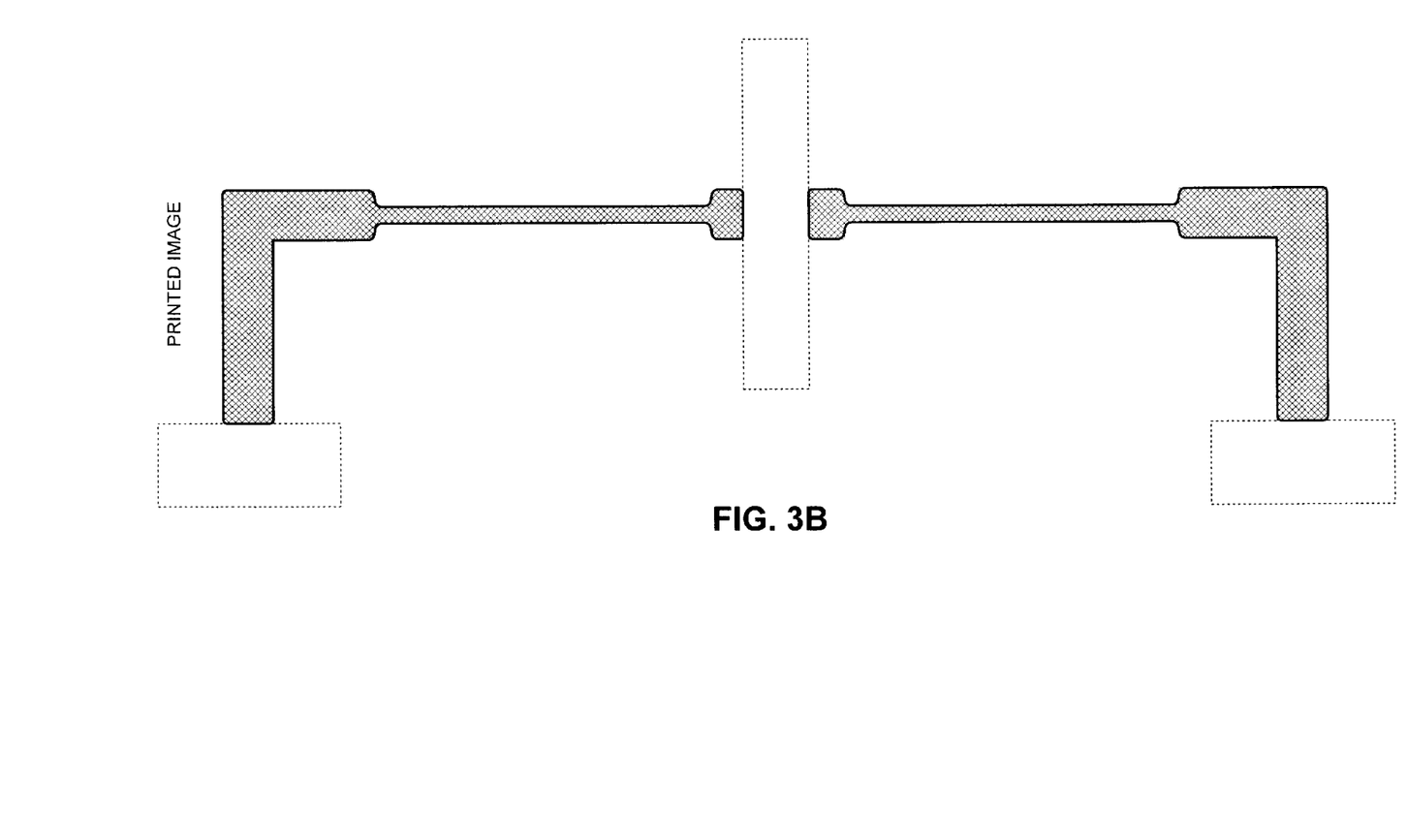
FIG. 3B illustrates the resulting line ends from using exposure regions in accordance with an embodiment of the invention.

FIG. 3B illustrates the resulting line ends from using exposure regions in accordance with an embodiment of the invention. By using the second mask to cut through the extended polysilicon lines, line ends are created without the optical line end shortening that arises from using a single mask to create line ends. This is because the second mask cuts the line end with an edge that crosses the extended polysilicon line. Since both the first mask and the second mask use edges to expose the photoresist layer, and not line ends, neither the exposure through the first mask nor the exposure through the second mask suffers from optical problems that result from exposing the photoresist layer through a line end feature on a mask.

Note that the invention is not limited to creating line ends in polysilicon lines. It can also used to create line ends in metal lines or any other type of signal line.

Also note that the photoresist layer can be exposed through the first mask prior to exposure through the second mask, or alternatively, the photo resist layer can be exposed through the second mask prior to exposure through the first mask.

Furthermore, note that by using exposure regions 306–308 to cut through the extended lines, a closer separation can be achieved between line ends. For example, the line ends created by exposure region 307 can be closer together than would be possible if hammer heads where used, because hammer heads may require additional separation between the line ends.

Wafer Fabrication Process

Figure 4:
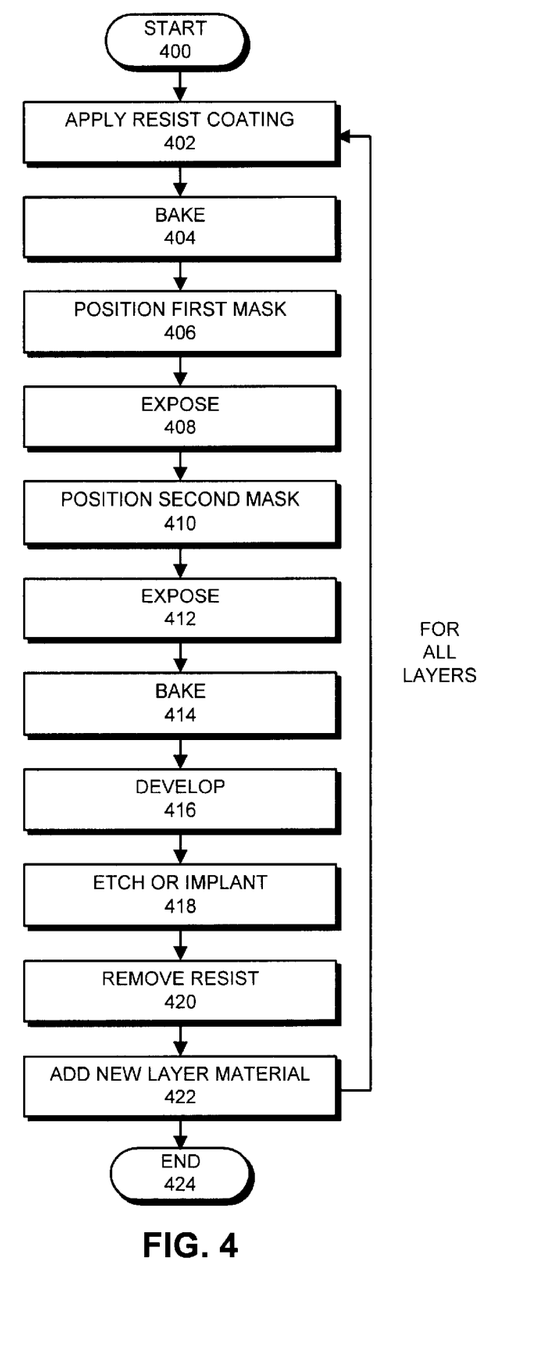
FIG. 4 is a flow chart illustrating the wafer fabrication process in accordance with an embodiment of the invention.

FIG. 4 is a flow chart illustrating the wafer fabrication process in accordance with an embodiment of the invention. The system starts by applying the resist coating to the top surface of a wafer (step 402). Next, the system bakes the resist layer (step 404). The system then positions the first mask over the photoresist layer (step 406), and then exposes the photoresist layer through the first mask (step 408). Next, the system positions the second mask over the photoresist layer (step 410), and then exposes the photoresist layer through the second mask (step 412). The system then bakes the wafer again (step 414) before developing the photoresist layer (step 416). Next, either a chemical etching or ion implantation step takes place (step 418) before the photoresist layer is removed (step 420). Finally, a new layer of material can be added and the process can be repeated for the new layer (step 422).

Creating Masks to Control Line End Shortening

Figure 5:
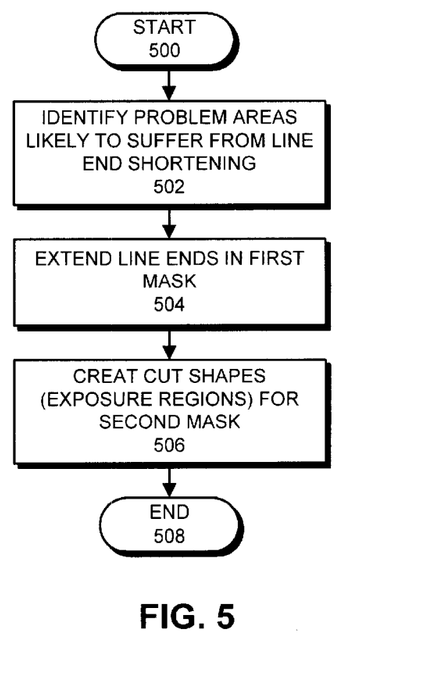
FIG. 5 is a flow chart illustrating the process of creating two masks to produce line ends in accordance with an embodiment of the invention.

FIG. 5 is a flow chart illustrating the process of creating two masks to produce line ends in accordance with an embodiment of the invention. The system starts by identifying problem areas that are likely to by adversely affected by line end shortening problems (step 502). This can be accomplished by examining minimum spacing and minimum line widths in critical areas, such as contact overlays, via overlays, metal overlays, and endcap areas. Next, the system extends (or merges) existing line ends in creating a first mask (step 504). Note that a line end extension may be co-linear with the rest of the line, as is illustrated in FIG. 3. Alternatively, in another embodiment of the present invention, a line end extension may extend in other directions in order to merge with nearby features in the layout.

The system also creates cut shapes in the second mask to form exposure regions on the underlying photoresist layer (step 506). The first and second masks are then used in the wafer fabrication process outlined in FIG. 4 above.

Note that the above process can be carried out automatically under software control. Alternatively, the above process can be carried out manually by a human being.

Using a Phase Shifter with Widened Regulator

Figure 8:
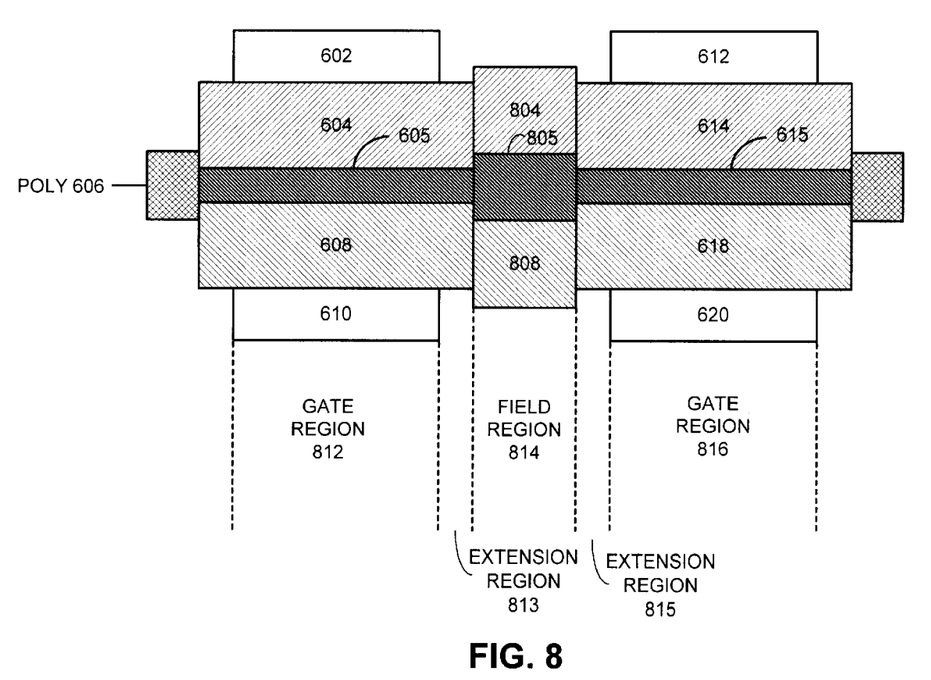
FIG. 8 illustrates the technique of using a phase shifter with a widened regulator to protect a polysilicon line in a field region in accordance with an embodiment of the invention.

FIG. 8 illustrates the technique of using an additional phase shifter with a widened regulator to protect a polysilicon line in a field region in accordance with an embodiment of the invention.

This additional phase shifter is placed over polysilicon line 606 as it passes through field region 814 between the first and second transistors. This additional phase shifter is composed of a zero-degree phase clear area 804, and a 180-degree phase clear area 808, that are separated by widened chromium regulator 805. This widened regulator 805 protects the underlying polysilicon line 606 from becoming significantly reduced in width by the additional phase shifter, while at the same time protecting polysilicon line 606 in field region 814 from incidental exposure.

Polysilicon line 606 passes through gate regions 812 and 816 within the first and second transistors, extension regions 813 and 815, and field region 814 between the first and second transistors. Note that the various embodiments can generally have different regulator widths in each of the three different types of regions.

Figure 9:
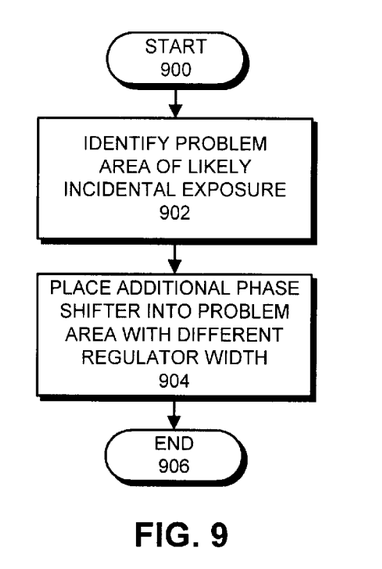
FIG. 9 is a flow chart illustrating the process of placing an additional phase shifter with a widened regulator over a polysilicon line in a field region in accordance with an embodiment of the invention.

FIG. 9 is a flow chart illustrating the process of placing an additional phase shifter with a widened regulator over a polysilicon line in a field region in accordance with an embodiment of the invention. The system starts by identifying a problem area of likely incidental exposure in the vicinity of a phase shifter on the phase shifting mask (step 902). The system then places an additional phase shifter with a wider chromium regulator into the problem area in order to protect an underlying polysilicon line 606 from incidental exposure, while at the same time protecting the polysilicon line 606 from becoming significantly reduced in width (step 904).

Note that the above process can be carried out automatically under software control. Alternatively, the above process can be carried out manually by a human being.

Also note that the above process can create a semiconductor chip with polysilicon lines in field regions in close proximity to features created through phase shifting without problems of incidental exposure, and without the line width reduction problems caused by extending phase shifters.

Extending Phase Shifters and Using Exposure Regions to Create Line Ends

Figure 10A:
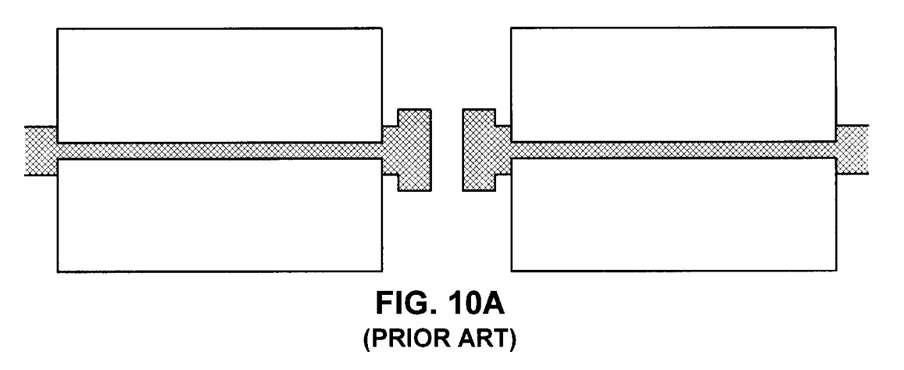
FIG. 10A illustrates the use of hammer heads to compensate for the line end shortening problem.

FIG. 10A illustrates the use of hammer heads to compensate for the line end shortening problem. As noted above, these hammer heads may create design rule violations that necessitate a wider separation between transistors. As was mentioned above with reference to FIG. 3, this problem can be remedied by adding a polysilicon line extension 303 and cutting the line extension 303 with an exposure region 307.

Figure 10B:
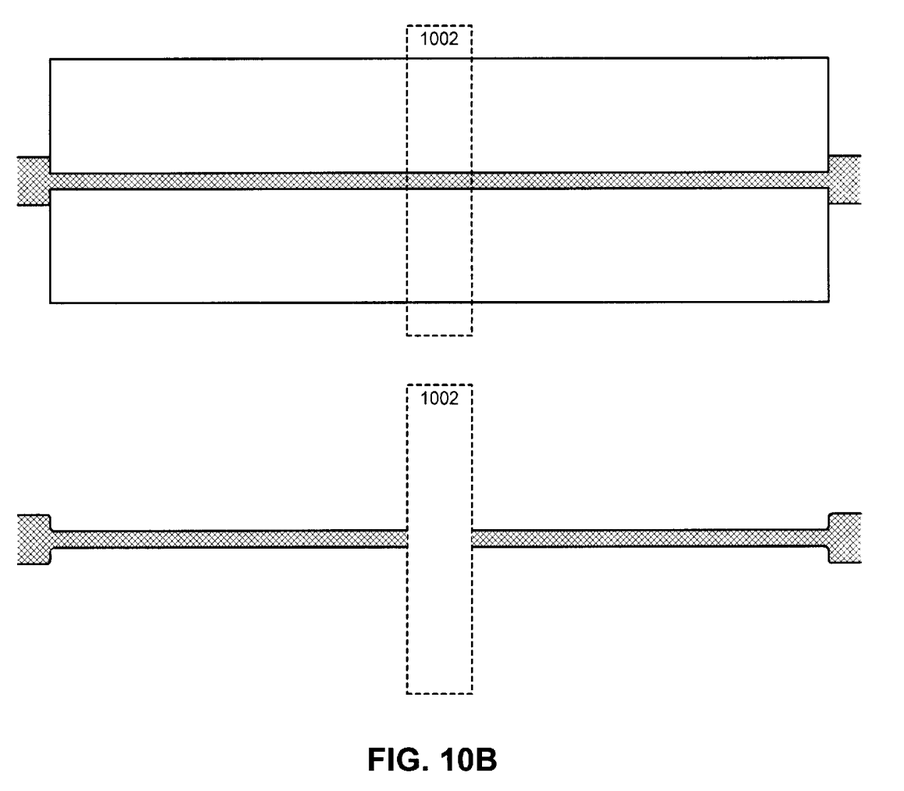
FIG. 10B illustrates the use of exposure regions and extended phase shifters to create line ends in accordance with an embodiment of the invention.

Another way to solve this problem is to extend the polysilicon lines and the phase shifters of the two transistors so that they form a single unified phase shifter that operates on a single unified polysilicon line, as is illustrated in the top portion of FIG. 10B. This single unified polysilicon line is then cut with an exposure region 1002 to form line ends as is illustrated in the bottom portion of FIG. 10B.

Note that the single unified phase shifter in FIG. 10 may have a different width (and possibly a different chromium regulator width) in the region between the line ends as is illustrated in FIG. 8.

The foregoing descriptions of embodiments of the invention have been presented for purposes of illustration and description only. They are not intended to be exhaustive or to limit the invention to the forms disclosed. Accordingly, many modifications and variations will be apparent to practitioners skilled in the art. Additionally, the above disclosure is not intended to limit the invention. The scope of the invention is defined by the appended claims.

What is claimed is:

1. A method for using double exposure, involving a phase shifting mask and a binary mask, during a semiconductor fabrication process to create a line end in a manner that controls line end shortening arising from optical effects, comprising:

creating the phase-shifting mask by extending an unexposed line into an exposure region defined by the binary mask, so that the exposure region cuts through the extended unexposed line to create the line end;

positioning the phase shifting mask over a photoresist layer on a surface of a semiconductor wafer;

wherein the phase-shifting mask includes opaque regions and transmissive regions, some of which form phase-shifters, that are organized into a first pattern that defines the unexposed line on the photoresist layer;

exposing the photoresist layer through the phase-shifting mask;

positioning the binary mask over the photoresist layer on the surface of the semiconductor wafer;

wherein the binary mask includes opaque regions and transmissive regions that are organized into a second pattern that defines the exposure region;

wherein the exposure region cuts through the unexposed line on the photoresist layer to create the line end in the unexposed line; and exposing the photoresist layer through the binary mask.

2. The method of claim 1, wherein the exposure region includes a border that cuts through the unexposed line at a substantially 90-degree angle to create the line end in the unexposed line.

3. A method for performing a mask conversion to facilitate a double exposure process, involving a phase shifting mask and a binary mask, during semiconductor fabrication to create a line end in a manner that controls line end shortening arising from optical effects, comprising:

receiving a description of the phase shifting mask, wherein the phase-shifting mask includes opaque regions and transmissive regions, some of which form phase-shifters, that are organized into a first pattern;

receiving a description of the binary mask, wherein the binary mask includes opaque regions and transmissive regions that are organized into a second pattern;

identifying a line end defined by the first pattern and/or the second pattern that is likely to suffer from line end shortening;

modifying the binary mask so that the binary mask includes an exposure region that cuts through an unexposed line defined by the phase shifting mask to create the line end;

modifying the phase shifting mask by extending the unexposed line into the exposure region defined by the binary mask, so that the exposure region cuts through the extended unexposed line to create the line end.

4. The method of claim 3, further comprising removing geometrical features that were added to the phase shifting mask and/or the binary mask to compensate for line end shortening.

5. A method for performing a mask conversion to facilitate a double exposure process during semiconductor fabrication to create a line end in a manner that controls line end shortening arising from optical effects, comprising:

receiving a description of a first binary mask, wherein the first binary mask includes opaque regions and transmissive regions that are organized into a first pattern;

receiving a description of the second binary mask, wherein the second binary mask includes opaque regions and transmissive regions that are organized into a second pattern;

identifying a line end defined by the first pattern and/or the second pattern that is likely to suffer from line end shortening; and modifying the first binary mask and/or the second binary mask so that the second mask includes an exposure region that cuts through an unexposed line defined by the first mask to create the line end.

6. The method of claim 5, further comprising removing geometrical features that were added to the first binary mask and/or the second binary mask to compensate for line end shortening.

7. The method of claim 5, further comprising creating the first binary mask by extending the unexposed line into the exposure region defined by the second binary mask, so that the exposure region cuts through the extended unexposed line to create the line end.

8. A method for using double exposure during a semiconductor fabrication process to create a line end in a manner that controls line end shortening arising from optical effects, comprising:

creating a first mask by extending an unexposed line into an exposure region defined by a second mask, so that the exposure region cuts through the extended unexposed line to create the line end;

positioning the first mask over a photoresist layer on a surface of a semiconductor wafer;

wherein the first mask includes opaque regions and transmissive regions that are organized into a first pattern that defines the unexposed line on the photoresist layer;

exposing the photoresist layer through the first mask;

positioning the second mask over the photoresist layer on the surface of the semiconductor wafer;

wherein the second mask includes opaque regions and transmissive regions that are organized into a second pattern that defines the exposure region;

wherein the exposure region cuts through the unexposed line on the photoresist layer to create the line end in the unexposed line, without the optical line end shortening that arises from creating the line end with a single mask; and exposing the photoresist layer through the second mask.

9. The method of claim 8, wherein exposing the photoresist layer through the first mask takes place before exposing the photoresist layer through the second mask.

10. The method of claim 8, wherein exposing the photoresist layer through the second mask takes place before exposing the photoresist layer through the first mask.

11. The method of claim 8, wherein the exposure region includes a border that cuts through the unexposed line at a substantially 90-degree angle to create the line end in the unexposed line.

12. The method of claim 8, wherein the exposure region cuts through the unexposed line to create two opposing line ends on opposite sides of the exposure region.

13. The method of claim 8, wherein one of the first mask and the second mask is also a phase shifting mask that includes a set of structures that use phase shifting to produce regions of destructive interference on the photoresist layer.

14. The method of claim 13, wherein the phase shifting mask includes:

an existing phase shifter that is configured to create a region of destructive interference on the photoresist layer;

a problem area of likely incidental exposure in close proximity to the existing phase shifter within the phase shifting mask;

wherein the problem area includes a polysilicon line passing through a field region of a semiconductor chip;

wherein the incidental exposure is likely to degrade the polysilicon line passing through the field region; and an additional phase shifter located in the problem area on the phase shifting mask so that a regulator within the additional phase shifter protects the polysilicon line passing through the field region;

wherein the additional phase shifter has a wider regulator than the existing phase shifter, wherein the existing phase shifter is used to expose a polysilicon line in a gate region of the semiconductor chip.

15. The method of claim 8, wherein the second pattern on the second mask defines a plurality of exposure regions for cutting through a plurality of unexposed lines defined by the first mask.

16. The method of claim 8, wherein the second pattern on the second mask additionally defines a second unexposed line; and wherein the first pattern on the first mask additionally defines a second exposure region that cuts through the second unexposed line to create the line end in the second unexposed line.

17. A set of masks for use in a semiconductor fabrication process that facilitates using double exposure to create a line end in a manner that controls line end shortening arising from optical effects, comprising:

a first mask having opaque regions and transmissive regions that are organized into a first pattern that defines an unexposed line on a photoresist layer on a surface of a semiconductor wafer when positioned under the first mask;

wherein the first mask is created by extending the unexposed line into an exposure region defined by a second mask, so that the exposure region cuts through the extended unexposed line to create the line end; and the second mask having opaque regions and transmissive regions that are organized into a second pattern that defines the exposure region on the photoresist layer when positioned under the second mask;

wherein the exposure region cuts through the unexposed line defined by the first mask on the photoresist layer to create the line end in the unexposed line, without the optical line end shortening that arises from creating the line end with a single mask.

18. The set of masks of claim 17, wherein the exposure region includes a border that cuts through the unexposed line at a substantially 90-degree angle to create the line end in the unexposed line.

19. The set of masks of claim 17, wherein the exposure region cuts through the unexposed line to create two opposing line ends on opposite sides of the exposure region.

20. The set of masks of claim 17, wherein one of the first mask and the second mask is also a phase shifting mask that includes a set of structures that use phase shifting to produce regions of destructive interference on the photoresist layer.

21. The set of masks of claim 20, wherein the phase shifting mask includes:

an existing phase shifter that is configured to create a region of destructive interference on the photoresist layer;

a problem area of likely incidental exposure in close proximity to the existing phase shifter within the phase shifting mask;

wherein the problem area includes a polysilicon line passing through a field region of a semiconductor chip;

wherein the incidental exposure is likely to degrade the polysilicon line passing through the field region; and an additional phase shifter located in the problem area on the phase shifting mask so that a regulator within the additional phase shifter protects the polysilicon line passing through the field region;

wherein the additional phase shifter has a wider regulator than the existing phase shifter, wherein the existing phase shifter is used to expose a polysilicon line in a gate region of the semiconductor chip.

22. The set of masks of claim 17, wherein the second pattern on the second mask defines a plurality of exposure regions for cutting through a plurality of unexposed lines defined by the first mask.

23. The set of masks of claim 17, wherein the second pattern on the second mask additionally defines a second unexposed line; and wherein the first pattern on the first mask additionally defines a second exposure region that cuts through the second unexposed line to create the line end in the second unexposed line.

24. The set of masks of claim 17, wherein the photoresist layer is exposed through the first mask before the photoresist layer is exposed through the second mask.

25. The set of masks of claim 17, wherein the photoresist layer is exposed through the second mask before the photoresist layer is exposed through the first mask.

26. A computer-readable storage medium storing instructions that when executed by a computer cause the computer to perform a method for creating a pair of masks to facilitate double exposure during a semiconductor fabrication process to create a line end in a manner that controls line end shortening arising from optical effects, comprising:

identifying areas in a layout for a semiconductor chip that are likely to suffer from line end shortening problems;

creating a first mask including opaque regions and transmissive regions that are organized into a first pattern that defines an unexposed line on a photoresist layer on a surface of a semiconductor wafer when positioned under the first mask;

wherein creating the first mask involves extending the unexposed line into an exposure region defined by a second mask, so that the exposure region cuts through the extended unexposed line to create the line end; and creating the second mask including opaque regions and transmissive regions that are organized into a second pattern that defines the exposure region on the photoresist layer when positioned under the second mask;

wherein the exposure region cuts through the unexposed line on the photoresist layer to create the line end in the unexposed line, without the optical line end shortening that arises from creating the line end with a single mask.

27. A system for using double exposure during a semiconductor fabrication process to create a line end in a manner that controls line end shortening arising from optical effects, comprising:

a first means including opaque regions and transmissive regions that are organized into a first pattern for defining an unexposed line on a photoresist layer on a surface of a semiconductor wafer when positioned under the first means;

wherein the first means is created by extending the unexposed line into an exposure region defined by a second means, so that the exposure region cuts through the extended unexposed line to create the line end;

the second means including opaque regions and transmissive regions that are organized into a second pattern for defining the exposure region on the photoresist layer when positioned under the second mask means;

wherein the exposure region cuts through the unexposed line on the photoresist layer to create the line end in the unexposed line, without the optical line end shortening that arises from creating the line end with a single mask means;

a positioning means for positioning the first means and the second means over the photoresist layer; and an exposure means for exposing the photoresist layer through the first means and the second means.

28. An integrated circuit including a line end created through a double exposure process that controls line end shortening arising from optical effects, the double exposure process comprising:

creating the phase-shifting mask by extending the unexposed line into the exposure region defined by the binary mask, so that the exposure region cuts through the extended unexposed line to create the line end;

positioning the phase shifting mask over a photoresist layer on a surface of a semiconductor wafer;

wherein the phase-shifting mask includes opaque regions and transmissive regions, some of which form phase-shifters, that are organized into a first pattern that defines an unexposed line on the photoresist layer;

exposing the photoresist layer through the phase-shifting mask;

positioning the binary mask over the photoresist layer on the surface of the semiconductor wafer;

wherein the binary mask includes opaque regions and transmissive regions that are organized into a second pattern that defines an exposure region;

wherein the exposure region cuts through the unexposed line on the photoresist layer to create the line end in the unexposed line; and exposing the photoresist layer through the binary mask.

29. A semiconductor structure within an integrated circuit that is formed through a double exposure process that controls line end shortening arising from optical effects, the semiconductor structure comprising:

a first transistor including a first gate;

a second transistor including a second gate;

wherein the first gate and the second gate are formed by,
using a first mask including opaque regions and transmissive regions defining a polysilicon line, and by
using a second mask including opaque regions and transmissive regions defining an exposure region,
wherein the exposure region cuts through the polysilicon line defined by the first mask to form the first gate and the second gate.

30. The semiconductor structure of claim 29, wherein the first gate and the second gate are formed by phase shifters on the first mask.

31. The semiconductor structure of claim 30, wherein a single phase shifter in the first mask extends across both the first gate and the second gate.

\* \* \* \* \*